United States Patent
Damitio et al.

(10) Patent No.: US 7,102,440 B2
(45) Date of Patent: Sep. 5, 2006

(54) HIGH OUTPUT CURRENT WIDEBAND OUTPUT STAGE/BUFFER AMPLIFIER

(75) Inventors: Paul G. Damitio, Tucson, AZ (US); Sergey Alenin, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/856,140

(22) Filed: May 28, 2004

(65) Prior Publication Data

US 2005/0264358 A1 Dec. 1, 2005

(51) Int. Cl.
*H03F 3/26* (2006.01)

(52) U.S. Cl. ............... 330/267; 330/263; 330/288
(58) Field of Classification Search ........... 330/262, 330/263, 267, 288
See application file for complete search history.

(56) References Cited

U.S. PATENT DOCUMENTS

| | | | |
|---|---|---|---|
| 5,323,122 A * | 6/1994 | Bowers | 330/267 |
| 5,736,902 A | 4/1998 | Graeme | 330/296 |
| 5,786,729 A | 7/1998 | Smith | 330/255 |
| 5,786,731 A | 7/1998 | Bales | 330/267 |
| 5,939,944 A | 8/1999 | Gibson | 330/255 |
| 6,501,334 B1 * | 12/2002 | Corsi et al. | 330/267 |
| 6,586,998 B1 * | 7/2003 | Moraveji | 330/267 |

* cited by examiner

*Primary Examiner*—Khanh Van Nguyen
(74) *Attorney, Agent, or Firm*—W. James Brady; Frederick J. Telecky, Jr.

(57) ABSTRACT

A high output current wideband output stage/buffer amplifier that has reduced quiescent current requirements. The output stage/buffer amplifier includes a diamond follower circuit having a pair of complementary output load-driving bipolar junction transistors (BJTs), a pair of pre-driver BJTs, and a plurality of current boost BJTs. As the base current of one of the driver transistors starts to increase in response to an increasing load current, the current through a corresponding pre-driver transistor decreases, thereby increasing the collector current of a corresponding boost transistor. The increased collector current of the boost transistor is fed back to a current mirror, causing a concomitant increase in the base current of the driver transistor.

13 Claims, 2 Drawing Sheets

HIGH OUTPUT CURRENT WIDEBAND OUTPUT STAGE/BUFFER AMPLIFIER

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present application relates generally to output stages for analog circuits, and more specifically to high output current wideband output stages for amplifiers.

Amplifiers are known that employ a number of stages to produce amplification of electrical signals. A conventional amplifier generally includes one or more amplifying stages followed by an output stage. Output stages typically serve a number of functions. For example, an output stage may be included in a buffer amplifier to provide (1) an appropriate output impedance, (2) a large output voltage swing, and/or (3) a large output current drive. Output stages may also be configured to provide additional amplification for amplifier circuits.

Conventional amplifier output stages have drawbacks, however, particularly when the output stages are implemented using bipolar junction transistors (BJTs). This is because for output stages that include BJTs, high beta ($\beta$) and good saturation characteristics are often traded-off against amplifier speed. For example, because the $\beta$ of high frequency BJTs is normally relatively low, the current gain of such transistors can also be relatively low. As a result, when high frequency BJTs are employed in the output stage of a buffer amplifier, large bias current sources are usually required to enable the output stage to produce a sufficiently large output current drive. However, such large current sources can significantly increase the quiescent current of the output stage, thereby increasing the overall power requirements of the amplifier.

One way of increasing the current gain of an amplifier is to increase the number of stages. However, although the inclusion of additional stages may improve the output drive current capability of an amplifier, such an approach can increase the quiescent current, reduce the output voltage swing, and reduce the bandwidth of the amplifier.

It would therefore be desirable to have an improved output stage for an amplifier. Such an output stage would include high frequency transistors and would provide high output current drive capability without sacrificing amplifier speed. It would also be desirable to have an output stage that maintains a high signal current-to-quiescent current ratio for increased amplifier efficiency.

BRIEF SUMMARY OF THE INVENTION

In accordance with the present invention, a high output current wideband output stage/buffer amplifier is provided that has reduced quiescent current requirements. The presently disclosed output stage/buffer amplifier achieves such benefits by dynamically varying the base current provided to at least one output load-driving transistor in response to a given output load.

In one embodiment, the output stage/buffer amplifier comprises a diamond follower circuit that has a plurality of bipolar junction transistors (BJTs), including a pair of complementary output load-driving BJTs, a pair of complementary pre-driver BJTs, and a plurality of current boost BJTs. The output stage/buffer amplifier includes respective sense resistors coupled to the pre-driver transistors, and a plurality of current mirrors. As the base current of one of the driver transistors starts to increase in response to an increasing load current, the current through the pre-driver transistor corresponding to the driver transistor decreases. This decrease in current through the pre-driver transistor is sensed by the respective sense resistor coupled thereto, thereby increasing the $V_{BE}$ and therefore the collector current of a corresponding boost transistor. The increased collector current of the boost transistor is fed back to one of the current mirrors, causing a concomitant increase in the base current of the driver transistor.

By dynamically increasing the base current of an output load-driving transistor as output drive current requirements increase, high output current drive can be obtained without significantly increasing the quiescent current of the output stage. In this way, high output current drive capability can be achieved in output stages of amplifiers that employ high frequency bipolar junction transistors.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

A high output current wideband output stage/buffer amplifier is disclosed that provides high output current drive capability without sacrificing amplifier speed. The presently disclosed output stage/buffer amplifier is configured and arranged for dynamically varying the base current provided to at least one output load driving-transistor in response to changes in the value of a given output load.

Figure 1:
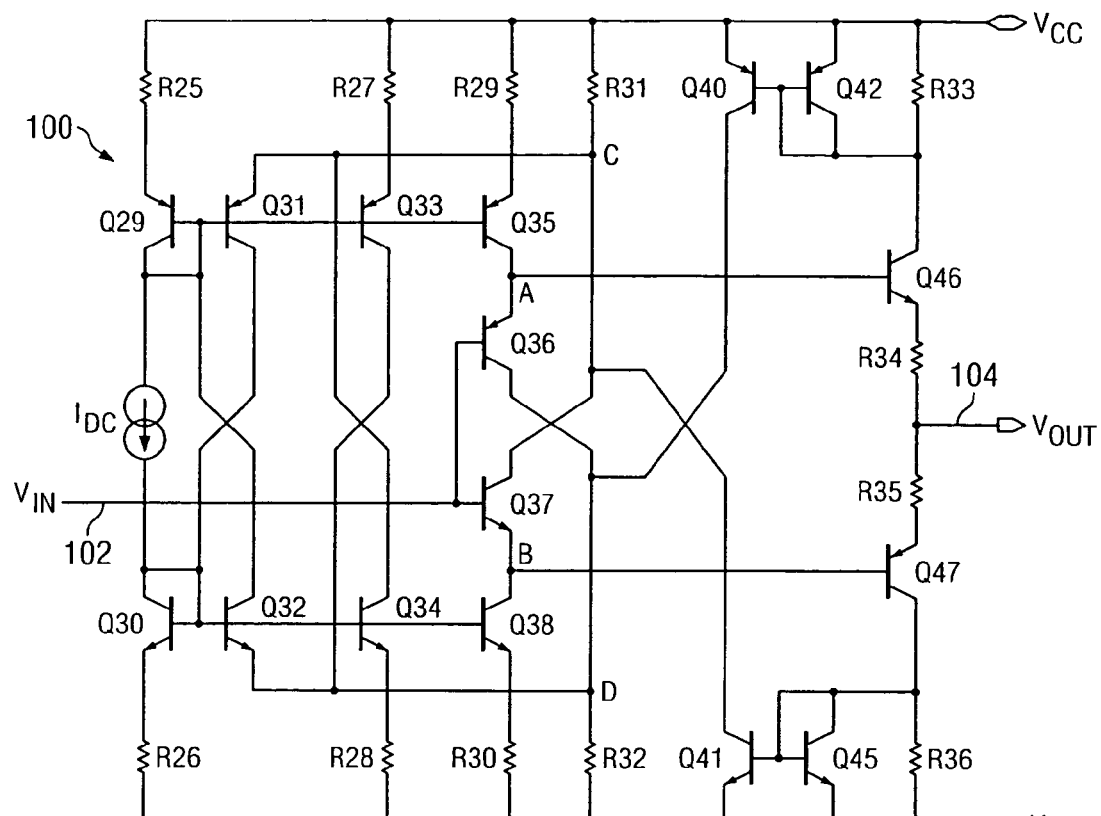
FIG. 1 is a schematic diagram of a high output current wideband output stage employing high frequency bipolar junction transistors according to the present invention.

FIG. 1 depicts an illustrative embodiment of a high output current wideband output stage 100, in accordance with the present invention. In the illustrated embodiment, the output stage 100 comprises a diamond follower circuit with associated current sources including a pair of complementary current mirror output transistors Q35 and Q38, a pair of complementary pre-driver transistors Q36–Q37, and a pair of complementary driver transistors Q46–Q47. Specifically, the emitter of the current mirror output transistor Q35 is coupled to a positive power supply source $V_{cc}$ via a resistor R29, and the emitter of the current mirror output transistor Q38 is coupled to a negative power supply source $V_{EE}$ via a resistor R30. Further, the emitter of the pre-driver transistor Q36 and the collector of the current mirror output transistor Q35 are connected at a circuit node A, which is connected to the base of the driver transistor Q46. Similarly, the emitter of the pre-driver transistor Q37 and the collector of the current mirror output transistor Q38 are connected to a circuit node B, which is connected to the base of the output driver transistor Q47. The collector of the driver transistor Q46 is coupled to the positive supply $V_{cc}$ via a sense resistor R33, and the collector of the driver transistor Q47 is coupled to the negative supply $V_{EE}$ via a sense resistor R36. Moreover, an input voltage $V_{IN}$ is provided via an input terminal 102 to the bases of the pre-driver transistors Q36–Q37, and the emitters of the driver transistors Q46–Q47 are coupled to an output terminal 104 via resistors R34–R35, respectively. The driver transistors Q46–Q47 are configured to receive complementary current signals from the pre-driver transistors Q36–Q37 at their respective bases, and to amplify the current signals to produce an output voltage $V_{OUT}$ at the output terminal 104 that is proportional to the input voltage $V_{IN}$ at the terminal 102. For example, the driver transistor Q46 may be configured to provide a desired output load-driving capability, and the driver transistor Q47 may be configured to provide a desired load current-sinking capability. It is understood that the output terminal 104 is connectable to a suitable output load (not shown).

As shown in FIG. 1, the collector of the pre-driver transistor Q37 is connected to a sense resistor R31 at a circuit node C, and the collector of the pre-driver transistor Q36 is connected to a sense resistor R32 at a circuit node D. The sense resistor R31 couples the collector of the pre-driver transistor Q37 to the positive supply $V_{cc}$, and the sense resistor R32 couples the collector of the pre-driver transistor Q36 to the negative supply $V_{EE}$. Further, the emitter of a transistor Q33 is coupled to the positive supply $V_{cc}$ via a resistor R27, and the emitter of a transistor Q34 is coupled to the negative supply $V_{EE}$ via a resistor R28. The emitter of a transistor Q31 and the collector of the transistor Q34 are connected to the circuit node C, and the emitter of a transistor Q32 and the collector of the transistor Q33 are connected to the circuit node D. Moreover, the collector of the transistor Q31 and the respective bases of the transistors Q32, Q34, and Q38 are connected to the input of a diode-connected transistor Q30; and, the collector of the transistor Q32 and the respective bases of the transistors Q31, Q33, and Q35 are connected to the input of a diode-connected transistor Q29. The emitter of the transistor Q29 is coupled to the positive supply $V_{cc}$ via a resistor R25, and the emitter of the transistor Q30 is coupled to the negative supply $V_{EE}$ via a resistor R26. A current source $I_{dc}$ is connected between the inputs of the diode-connected transistors Q29–Q30.

In addition, the base of a transistor Q40 is connected to the input of a diode-connected transistor Q42 to form a current mirror, and the base of a transistor Q41 is connected to the input of a diode-connected transistor Q45 to form another current mirror. The collector of the transistor Q41 is coupled to the positive supply $V_{cc}$ via the sense resistor R31, and the collector of the transistor Q40 is coupled to the negative supply $V_{EE}$ via the sense resistor R32. Further, the input of the diode-connected transistor Q42 is connected between the sense resistor R33 and the driver transistor Q46, and the input of the diode-connected transistor Q45 is connected between the sense resistor R36 and the driver transistor Q47.

In the presently disclosed embodiment, each one of the transistors included in the above-described output stage 100 is a high frequency bipolar junction transistor (BJT). For example, the pre-driver transistor Q36 and the driver transistor Q47 are high frequency PNP-type BJTs, and the pre-driver transistor Q37 and the driver transistor Q46 are high frequency NPN-type BJTs. It is understood, however, that the transistors employed in the output stage 100 may alternatively comprise any suitable type of transistor implemented in any suitable technology.

As described above, the output stage 100 (see FIG. 1) comprises a high output current wideband output stage for an amplifier, e.g., a buffer amplifier. In the presently disclosed embodiment, the output stage 100 is configured and arranged for dynamically varying the respective base currents provided to the driver transistors Q46–Q47 in response to a given output load (not shown) connectable to the output terminal 104. For example, in the event a load current being sourced to a predetermined output load increases, the base current required by the load-driving transistor Q46 also increases. As a result, the current flowing through the pre-driver transistor Q36 will decrease by an equal amount. The reduced current through the pre-driver transistor Q36 causes a corresponding drop in the voltage across the sense resistor R32, resulting in the voltage at node D becoming more negative. This causes an increase in the base-to-emitter voltage ($V_{BE}$) of the current boost transistor Q32, thereby causing the collector current of the boost transistor Q32 to increase. The increased collector current of the boost transistor Q32 is fed back to the diode-connected transistor Q29 to increase the current flowing through the transistor Q29. Because the transistor Q29 is the input and thus the controlling transistor for the current mirror output transistor Q35, the current in the transistor Q35 will increase, thereby providing additional current at node A. The increased current at node A maintains the bias of the pre-driver transistor Q36, while providing the increased base current to the output driver transistor Q46.

It is noted that the base of the current boost transistor Q31 is also connected to the input of the diode-connected transistor Q29 to form another current mirror, in which the transistor Q29 operates as the current mirror control transistor and the transistor Q31 operates as a current mirror output transistor. As a result, a portion of the increased current flowing through the current mirror control transistor Q29 is fed back to the input of the diode-connected transistor Q30 via the current mirror output transistor Q31, thereby increasing the current flowing through the transistor Q30. Because the base of the current mirror output transistor Q38 is connected to the input of the diode-connected transistor Q30, the transistor Q30 operates as a current mirror control transistor that increases the current via the collector of the transistor Q38 at node B. In this example, no additional current is required by the base of the driver transistor Q47 because the output stage is sourcing current to the load. Therefore, all of the additional current at node B flows in the pre-driver transistor Q37.

In the event the value of the predetermined output load is such that the driver transistor Q47 functions as a load current-sinking transistor, the base current required by the load-driving transistor Q47 will begin to increase as the current being sunk by the transistor Q47 increases. This will cause the current flowing in the pre-driver transistor Q37 to decrease by an equal amount. The decrease in current in the pre-driver transistor Q37 will cause a corresponding drop in the voltage across the sense resistor R31. This will result in the voltage at node C becoming more positive causing an increase in the $V_{BE}$ of the boost transistor Q31, thereby causing the collector current of the boost transistor Q31 to increase. The increased collector current of the boost transistor Q31 is fed back to the input of the diode-connected transistor Q30 to increase the current flowing through the transistor Q30. Because the transistor Q30 is the input and thus the controlling transistor for the current mirror output transistor Q38, the current in the transistor Q38 will increase, providing additional current at node B. The increased current at node B maintains the bias of the pre-driver transistor Q37, while providing the increased base current to the output driver transistor Q47.

It is noted that a portion of the increased current flowing through the transistor Q30 is fed back to the input of the diode-connected transistor Q29 via the boost transistor Q32, thereby increasing the current flowing through the transistor Q29. Because the transistors Q29 and Q35 are configured to operate as current mirror control and output transistors, respectively, the current via the collector of the transistor Q35 will increase at node A. Accordingly, as in the previous example, no additional current is required by the base of the driver transistor Q46 because the output stage is sinking current to the load. Therefore, all of the additional current at node A flows in the pre-driver transistor Q36.

It should be understood that the transistors Q33–Q34 included in the output stage 100 are operative to regulate the boost currents provided by the boost transistors Q31–Q32, respectively. In the preferred embodiment, the transistors Q33–Q34 are operative to limit the current fed back to the non-load-driving side of the output stage 100 to about one-fifth of the base current of the output load-driving transistor. Those of ordinary skill in this art will appreciate that such current values can be specified by appropriate selection of the geometries of the relevant transistors.

It is further understood that the output stage 100 (see FIG. 1) is current limited via the current mirror formed by the transistors Q40 and Q42, and via the current mirror formed by the transistors Q41 and Q45. The current flowing through the driver transistor Q46 is limited as follows. As the collector current of the driver transistor Q46 increases, the voltage drop across the sense resistor R33 increases, subsequently causing current to flow through the current mirror control transistor Q42. The current flowing through the transistor Q42 is mirrored in the current mirror output transistor Q40, the collector of which is connected to the sense resistor R32. Because the current flowing through the sense resistor R32 is increased, the $V_{BE}$ of the boost transistor Q32 is decreased, thereby limiting the boost current flowing through the transistor Q32. Because the current flowing through the boost transistor Q32 is limited, the current provided to the base of the driver transistor Q46 via the transistors Q29 and Q35 is also limited.

The current flowing through the driver transistor Q47 is similarly limited as follows. As the collector current of the driver transistor Q47 increases, the voltage drop across the sense resistor R36 increases, subsequently causing current to flow through the current mirror control transistor Q45. The current flowing through the transistor Q45 is mirrored in the current mirror output transistor Q41, the collector of which is connected to the sense resistor R31. Because a portion of the current previously supplied to the boost transistor Q31 via the sense resistor R31 is provided to the current mirror output transistor Q41 when current starts to flow through the current mirror control transistor Q45, the boost current flowing through the transistor Q31 is limited. Because the current flowing through the boost transistor Q31 is limited, the current provided to the base of the driver transistor Q47 via the transistors Q30 and Q38 is also limited.

Figure 2A:
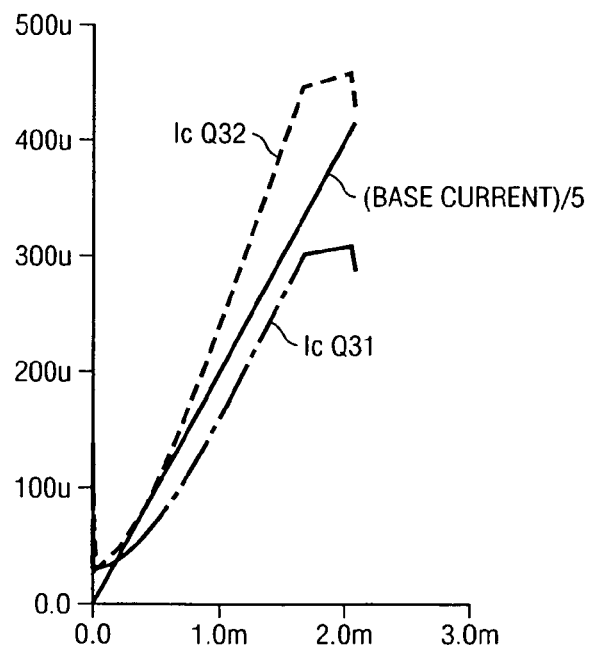
FIGS. 2a–2b are graphical representations of base currents versus boost currents associated with driver transistors and current boost transistors, respectively, included in the output stage of FIG. 1.
Figure 2B:
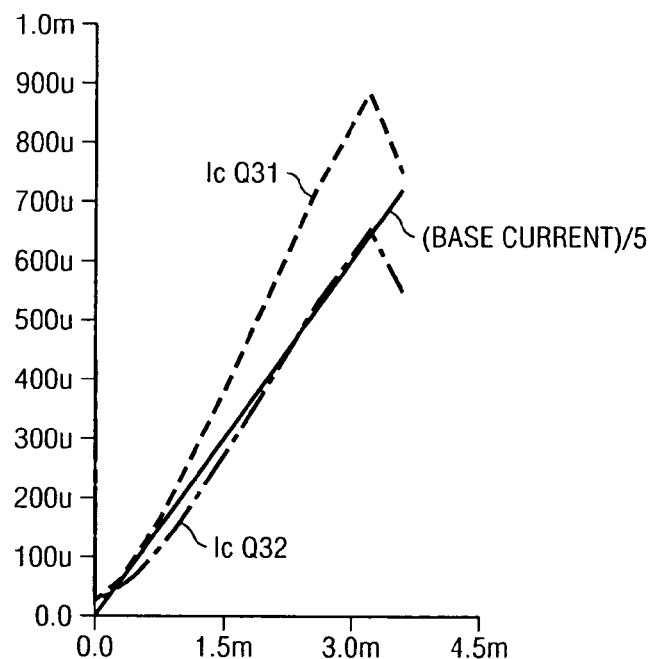

FIGS. 2a–2b depict the boost currents flowing through the transistors Q31–Q32 as functions of the base currents of the driver transistors Q46–Q47, respectively. Specifically, FIG. 2a depicts the collector currents Ic of the boost transistors Q31–Q32, and one-fifth of the base current of the output load-driving transistor Q46, as functions of the base current of the transistor Q46. As shown in FIG. 2a, the non-load-driving side of the output stage 100 represented by the collector current Ic of the boost transistor Q31 substantially tracks the base current of the output load-driving transistor Q46 divided by five. Further, in the presently disclosed embodiment, the collector currents of the boost transistors Q31–Q32 are limited to about 300 µA and 450 µA, respectively.

Similarly, FIG. 2b depicts the collector currents Ic of the boost transistors Q31–Q32, and one-fifth of the base current of the load current-sinking transistor Q47, as functions of the base current of the transistor Q47. As shown in FIG. 2b, the non-load-driving side of the output stage 100 represented by the collector current Ic of the boost transistor Q32 substantially tracks the base current of the load current-sinking transistor Q47 divided by five. Further, in the presently disclosed embodiment, the collector currents of the boost transistors Q31–Q32 are limited to about 900 µA and 600 µA, respectively.

Figure 3:
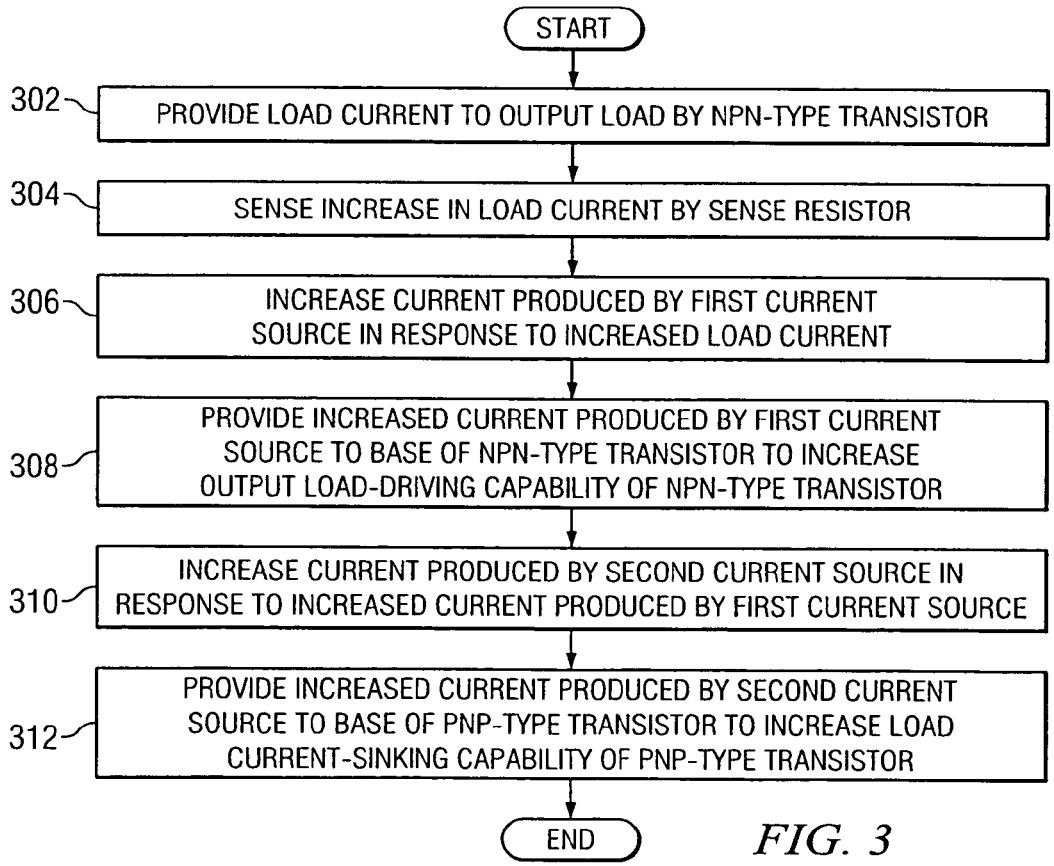
FIG. 3 is a flow diagram illustrating a method of operating the output stage of FIG. 1.

A method of operating the presently disclosed high output current wideband output stage/buffer amplifier is illustrated by reference to FIG. 3. As depicted in step 302, a load current is provided to an output load by an NPN-type output load-driving transistor. Next, an increase in the load current is sensed, as depicted in step 304, by a current-sensing resistor. Current produced by a first current source is then increased, as depicted in step 306, in response to the increased load current sensed by the sense resistor. Next, the increased current produced by the first current source is provided, as depicted in step 308, to the base of the NPN-type driver transistor, thereby increasing the output load-driving capability of the NPN-type transistor. Current produced by a second current source is then increased, as depicted in step 310, in response to the increased current produced by the first current source. Next, the increased current produced by the second current source is provided, as depicted in step 312, to the base of a PNP-type driver transistor, thereby increasing the load current-sinking capability of the PNP-type transistor.

Having described the above illustrative embodiments, other alternative embodiments or variations may be made. For example, it was described that the presently disclosed output stage is configured for increasing both the output load-driving capability and the load current-sinking capability of the driver transistors Q46–Q47, respectively. However, in an alternative embodiment, the boost transistor Q31 may be disconnected from the current mirror including the transistors Q30 and Q32, and the boost transistor Q32 may be disconnected from the current mirror including the transistors Q29 and Q31, thereby allowing the respective output load-driving and load current-sinking capabilities of the transistors Q46–Q47 to be varied individually as needed.

It will also be appreciated by those of ordinary skill in the art that modifications to and variations of the above-described high output current wideband output stage/buffer amplifier may be made without departing from the inventive concepts disclosed herein. Accordingly, the invention should not be viewed as limited except as by the scope and spirit of the appended claims.

What is claimed is:
1. An output stage for an amplifier circuit, comprising:
   input and output terminals, the input terminal being configured to receive an input signal, and the output terminal being coupled to an output load;

first and second pre-driver transistors having respective bases, emitters, and collectors, the respective bases of the first and second pre-driver transistors being connected to the input terminal, the collector of the first pre-driver transistor being electrically coupled to a negative power supply source, and the collector of the second pre-driver transistor being electrically coupled to a positive power supply source;

first and second driver transistors having respective bases, emitters, and collectors, the base of the first driver transistor being connected to the emitter of the first pre-driver transistor at a first circuit node, the base of the second driver transistor being connected to the emitter of the second pre-driver transistor at a second circuit node, the collector of the first driver transistor being electrically coupled to the positive supply, the collector of the second driver transistor being electrically coupled to the negative supply, and the respective emitters of the first and second driver transistors being electrically coupled to the output terminal; and first and second current sources having respective current outputs, the output of the first current source being connected to the first circuit node, and the output of the second current source being connected to the second circuit node, wherein, in the event a base current of the first driver transistor increases in response to an increased current through the output load, the first current source is configured to provide an increased current to the first circuit node, and wherein, in the event a base current of the second driver transistor increases in response to the increased current through the output load, the second current source is configured to provide an increased current to the second circuit node.

2. The output stage of claim 1 wherein the first and second current sources comprise first and second current mirrors, respectively, each current mirror including a control transistor and one or more output transistors, and wherein the control and output transistors have respective bases, emitters, and collectors.

3. The output stage of claim 2 wherein the first current mirror includes first and second output transistors, the first output transistor being configured to increase the current provided by the first current mirror in response to the increased current through the output load, and the second output transistor being configured to provide the increased current to the first node.

4. The output stage of claim 1 wherein each one of the first and second pre-driver transistors and the first and second driver transistors comprises a bipolar junction transistor.

5. An output stage for an amplifier circuit, comorising:

input and output terminals, the input terminal being configured to receive an input signal, and the output terminal being coupled to an input load;

first and second pre-driver transistors having respective bases, emitters, and collectors, the resoective bases of the first and second pre-driver transistors being connected to the input terminal, the collector of the first pre-driver transistor being electrically coupled to a negative power supply source, and the collector of the second pre-driver transistor being electrically coupled to a positive power supply source;

first and second driver transistors having respective bases, emitters, and collectors, the base of the first driver transistor being connected to the emitter of the first pre-driver transistor at a first circuit node, the base of the second driver transistor being connected to the emitter of the second pre-driver transistor at a second circuit node, the collector of the first driver transistor being electrically coupled to the positive supply, the collector of the second driver transistor being electrically coupled to the negative supply, and the respective emitters of the first and second driver transistors being electrically coupled to the output terminal; and first and second current sources having respective current outputs, the output of the first current source being connected to the first circuit node, and the output of the second current source being connected to the second circuit node, wherein, in the event a base current of the first driver transistor increases in response to an increased current through the output load, the first current source is configured to provide an increased current to the first circuit node, wherein, in the event a base current of the second driver transistor increases in response to the increased current through the output load, the second current source is configured to provide an increased current to the second circuit node, wherein the first and second current sources comprise first and second current mirrors, respectively, each current mirror including a control transistor and one or more output transistors, and wherein the control and output transistors have respective bases, emitters, and collectors, wherein the first current mirror includes first and second input transistors, the first output transistor being configured to increase the current provided by the first current mirror in response to the increased current through the output load, and the second output transistor being configured to provide the increased current to the first node, and wherein the collector of the first output transistor of the first current mirror is connected to the base of the control transistor of the second current mirror, and wherein the first output transistor of the first current mirror is configured to increase the current provided by the first current mirror and the second current mirror in response to the increased current through the output load.

6. An output stage for an amplifier circuit, comprising:

input and output terminals, the input terminal being configured to receive an input signal, and the output terminal being coupled to an output load;

first and second pre-driver transistors having respective bases, emitters, and collectors, the resoective bases of the first and second pre-driver transistors being connected to the input terminal, the collector of the first pre-driver transistor being electrically coupled to a negative Dower supply source, and the collector of the second pre-driver transistor being electrically coupled to a positive power supply source;

first and second driver transistors having resoective bases, emitters, and collectors, the base of the first driver transistor being connected to the emitter of the first pre-driver transistor at a first circuit node, the base of the second driver transistor being connected to the emitter of the second pre-diver transistor at a second circuit node, the collector of the first driver transistor being electrically coupled to the positive supply, the collector of the second driver transistor being electrically coupled to the negative supply, and the respective emitters of the first and second driver transistors being electrically coupled to the output terminal; and first and second current sources having respective current outputs, the output of the first current source being connected to the first circuit node, and the input of the second current source being connected to the second circuit node, wherein, in the event a base current of the first driver transistor increases in response to an increased current through the output load, the first current source is configured to provide an increased current to the first circuit node, wherein, in the event a base current of the second driver transistor increases in response to the increased current through the output load, the second current source is configured to provide an increased current to the second circuit node, wherein the first and second current sources comprise first and second current mirrors, respectively, each current mirror including a control transistor and one or more output transistors, and wherein the control and output transistors have respective bases, emitters, and collectors, and wherein the second current mirror includes first and second output transistors, the first output transistor being configured to increase the current provided by the second current mirror in response to the increased current through the output load, and the second output transistor being configured to provide the increased current to the second node.

7. The output stage of claim 6 wherein the collector of the first output transistor of the second current mirror is connected to the base of the control transistor of the first current mirror, and wherein the first output transistor of the second current mirror is configured to increase the current provided by the first current mirror and the second current mirror in response to the increased current through the output load.

8. A method of operating an output stage for an amplifier circuit, comprising the steps of:

providing input and output terminals, the output terminal being coupleable to an output load;

receiving an input signal by the input terminal;

providing first and second pre-driver transistors having respective bases, emitters, and collectors, the respective bases of the first and second pre-driver transistors being connected to the input terminal, the collector of the first pre-driver transistor being electrically coupled to a negative power supply source, and the collector of the second pre-driver transistor being electrically coupled to a positive power supply source;

providing first and second driver transistors having respective bases, emitters, and collectors, the base of the first driver transistor being connected to the emitter of the first pre-driver transistor at a first circuit node, the base of the second driver transistor being connected to the emitter of the second pre-driver transistor at a second circuit node, the collector of the first driver transistor being electrically coupled to the positive supply, the collector of the second driver transistor being electrically coupled to the negative supply, and the respective emitters of the first and second driver transistors being electrically coupled to the output terminal;

providing first and second current sources having respective current outputs, the output of the first current source being connected to the first node, and the output of the second current source being connected to the second node;

in the event a base current of the first driver transistor increases in response to an increased current through the output load, providing an increased current to the first node by the first current source; and in the event a base current of the second driver transistor increases in response to the increased current through the output load, providing an increased current to the second node by the second current source.

9. The method of claim 8 wherein the first and second current sources comprise first and second current mirrors, respectively, each current mirror including a control transistor and one or more output transistors, wherein the control and output transistors have respective bases, emitters, and collectors, wherein the first current mirror includes first and second output transistors, and further including the steps of increasing the current provided by the first current mirror in response to the increased current through the output load by the first output transistor, and providing the increased current to the first node by the second output transistor.

10. The method of claim 8 wherein each one of the first and second pre-driver transistors and the first and second driver transistors comprises a bipolar junction transistor.

11. A method of operating an output stage for an amplifier circuit, comprising the step of:

providing input and output terminals, the output terminal being coupleable to an output load;

receiving an input signal by the input terminal;

providing first and second pre-driver transistors having respective bases, emitters, and collectors, the respective bases of the first and second pre-driver transistors being connected to the input terminal, the collector of the first pre-driver transistor being electrically coupled to a negative power supply source, and the collector of the second pre-driver transistor being electrically coupled to a positive power supply source;

providing first and second driver transistors having respective bases, emitters, and collectors, the base of the first driver transistor being connected to the emitter of the first pre-driver transistor at a first circuit node, the base of the second driver transistor being connected to the emitter of the second pre-driver transistor at a second circuit node, the collector of the first driver transistor being electrically coupled to the positive supply, the collector of the second driver transistor being electrically coupled to the negative supply, and the respective emitters of the first and second driver transistors being electrically coupled to the output terminal;

providing first and second current sources having respective current outputs, the output of the first current source being connected to the first node, and the output of the second current source being connected to the second node;

in the event a base current of the first driver transistor increases in response to an increased current through the output load, providing an increased current to the first node by the first current source; and in the event a base current of the second driver transistor increases in response to the increased current through the output load, providing an increased current to the second node by the second current source, wherein the first and second current sources comprise first and second current mirrors, respectively, each current mirror including a control transistor and one or more output transistors, wherein the control and output transistors have resoective bases, emitters, and collectors, wherein the first current mirror includes first and second output transistors, and further including the steps of increasing the current provided by the first current mirror in response to the increased current through the output load by the first output transistor, and providing the increased current to the first node by the second output transistor, and wherein the collector of the first output transistor of the first current mirror is connected to the base of the control transistor of the second current mirror, and further including the step of increasing the current provided by the first current mirror and the second current mirror in response to the increased current through the output load by the first output transistor of the first current mirror.

12. A method of operating an output stage for an amplifier circuit, comprising the steps of:

providing input and output terminals, the output terminal being coupleable to an output load;

receiving an input signal by the input terminal;

providing first and second pre-driver transistors having respective bases, emitters, and collectors, the resoective bases of the first and second pre-driver transistors being connected to the input terminal, the collector of the first pre-driver transistor being electrically coupled to a negative power supply source, and the collector of the second pre-driver transistor being electrically coupled to a positive power supply source;

providing first and second driver transistors having resoective bases, emitters, and collectors, the base of the first driver transistor being connected to the emitter of the first pre-driver transistor at a first circuit node, the base of the second driver transistor being connected to the emitter of the second are-driver transistor at a second circuit node, the collector of the first driver transistor being electrically coupled to the positive supply, the collector of the second driver transistor being electrically coupled to the negative supply, and the resoective emitters of the first and second driver transistors being electrically coupled to the output terminal;

providing first and second current sources having respective current outputs, the output of the first current source being connected to the first node, and the output of the second current source being connected to the second node;

in the event a base current of the first driver transistor increases in response to an increased current through the output load, providing an increased current to the first node by the first current source; and in the event a base current of the second driver transistor increases in response to the increased current through the output load, providing an increased current to the second node by the second current source, wherein the first and second current sources comprise first and second current mirrors, respectively, each current mirror including a control transistor and one or more output transistors, wherein the control and output transistors have respective bases, emitters, and collectors, wherein the second current mirror includes first and second output transistors, and further including the steps of increasing the current provided by the second current mirror in response to the increased current through the output load by the first output transistor, and providing the increased current to the second node by the second output transistor.

13. The method of claim 12 wherein the collector of the first output transistor of the second current mirror is connected to the base of the control transistor of the first current mirror, and further including the step of increasing the current provided by the first current mirror and the second current mirror in response to the increased current through the output load by the first output transistor of the second current mirror.

* * * * *